United States Patent
Kaesser

(10) Patent No.: US 10,790,570 B2
(45) Date of Patent: Sep. 29, 2020

(54) RESONATOR WITH LIQUID CRYSTAL AND COMPENSATING ELEMENT

(71) Applicant: Tesat-Spacecom GmbH & Co. KG, Backnang (DE)

(72) Inventor: Tobias Kaesser, Stuttgart (DE)

(73) Assignee: TESAT-SPACECOM GMBH & CO. KG, Backnang (DE)

( * ) Notice: Subject to any disclaimer, the term of this patent is extended or adjusted under 35 U.S.C. 154(b) by 65 days.

(21) Appl. No.: 16/164,544

(22) Filed: Oct. 18, 2018

(65) Prior Publication Data

US 2019/0165762 A1  May 30, 2019

(30) Foreign Application Priority Data

Nov. 30, 2017  (DE) .................. 10 2017 128 368

(51) Int. Cl.
| | |
|---|---|
| *H01P 7/06* | (2006.01) |
| *H03H 9/24* | (2006.01) |
| *H03H 9/46* | (2006.01) |
| *H03H 9/02* | (2006.01) |
| *H01P 7/10* | (2006.01) |

(52) U.S. Cl.
CPC ............. *H01P 7/06* (2013.01); *H01P 7/10* (2013.01); *H03H 9/02448* (2013.01); *H03H 9/24* (2013.01); *H03H 9/46* (2013.01)

(58) Field of Classification Search
CPC ........ H03H 9/24; H03H 9/02448; H03H 9/46; H01P 7/10; H01P 7/06
USPC .......................................... 333/229
See application file for complete search history.

(56) References Cited

U.S. PATENT DOCUMENTS

| | | |
|---|---|---|
| 2003/0193379 A1 | 10/2003 | Lye et al. |
| 2016/0139445 A1 | 5/2016 | Zhu et al. |

FOREIGN PATENT DOCUMENTS

| | | |
|---|---|---|
| DE | 102016107955 A1 | 11/2017 |
| EP | 0580193 A2 | 1/1994 |
| EP | 3240102 A1 | 11/2017 |

OTHER PUBLICATIONS

Kang et al., "Anisotropic Thermal Interface Materials: Directional Heat Transfer in Uniaxially Oriented Liquid Crystal Networks", ACS Appl. Mater. Interfaces 2018, 10, 35557-35562. (Year: 2018).*
Data sheet of RexoliteTM of San Diego Plastics, Inc., 1996, CA 91950 (Year: 1996).*
German Patent Office, German Office Action for German Patent Application No. 10 2017 128 368.4, dated Oct. 31, 2018.

(Continued)

*Primary Examiner* — Benny T Lee
*Assistant Examiner* — Hafizur Rahman
(74) *Attorney, Agent, or Firm* — Jenkins, Wilson, Taylor & Hunt, P.A.

(57) ABSTRACT

A resonator for a filter is described. The resonator includes a resonator housing, in which a resonator space is formed, a container with a cavity, in which a liquid crystal is contained, the container being at least partially arranged in the resonator space, and a compensating element, which is arranged in the cavity. The compensating element has a coefficient of thermal expansion that is lower than a coefficient of thermal expansion of the liquid crystal.

11 Claims, 3 Drawing Sheets

(56) References Cited

OTHER PUBLICATIONS

Jost, M., et al., "Tuneable Hollow Waveguide Devices for Space Applications Based on Liquid Crystal," published in 2015 SBMO/IEEE, MTT-S Interernational Microwave and Optoelectronics Conference (IMOC), Porto de Galinhas, 2015, pp. 1-5.

Franke, T., et al., "Tunable Ka-band Waveguide Resonators and a Small Band Band-Pass Filter Based on Liquid Crystals," published in 44th European Microwave Conference, Oct. 6-9, 2014, Rome, Italy, pp. 339-342.

\* cited by examiner

RESONATOR WITH LIQUID CRYSTAL AND COMPENSATING ELEMENT

CROSS-REFERENCE TO PRIORITY APPLICATION

This application claims the benefit of, and priority to, German patent application number DE 10 2017 128 368.4, filed on Nov. 30, 2017. The content of the referenced application is incorporated by reference herein.

TECHNICAL FIELD

Embodiments of the subject matter described herein relate generally to a resonator, in particular a high-frequency resonator, and to a filter that has such a resonator.

BACKGROUND

Resonators and filters may use a dielectric, the permittivity of which can be adapted to give a resonant frequency or mid-frequency in the resonator. This involves using an electrical control field, which is generated by means of an electrode structure applied to LTCC (Low Temperature Cofired Ceramic) over resistor layers. The LTCC, and thus the electrode structures, are fixed on delimiting walls of the cavity resonator.

When such resonators are used in satellites, the resonators are sometimes subjected to great temperature fluctuations of 100 K or more in outer space. These temperature fluctuations have the effect that, on account of their coefficients of thermal expansion, the components used possibly expand or contract to different extents. These differences can be compensated for example by way of a compensating volume.

Patent publications DE 10 2016 107 955 A1 and EP 3 240 102 A1 describe a resonator with a dielectric container that is filled with a liquid crystal.

BRIEF SUMMARY

The object of the present disclosure is to provide an improved compensation for volume fluctuations of components in an adjustable resonator.

This object is achieved by the subject matter of the independent claim. Developments of the disclosed subject matter emerge from the dependent claims and from the following description.

According to one aspect, a resonator for a filter is provided. The resonator has a resonator housing, a container with a liquid crystal and a compensating element. In the resonator housing, a resonator space is formed. The container has a cavity, in which a liquid crystal is contained, the container being at least partially arranged in the resonator space. The compensating element is arranged in the cavity of the container. The compensating element has a coefficient of thermal expansion that is lower than a coefficient of thermal expansion of the liquid crystal.

The container does not have to be arranged completely in the resonator space. Rather, it is sufficient if only part of the container is arranged in the resonator space. The container is in this case arranged in particular such that at least part of the liquid crystal is in the resonator space. The container consequently forms a dielectric that influences the resonant frequency of the resonator.

The resonator housing may for example have a bottom portion, which is formed in one piece with side walls delimiting the resonator space, so that the resonator housing is at least partially formed as a cup. The open end of this structure may be closed by a cover, which then forms part of the resonator housing. The said elements of the resonator housing may be produced from the same material, for example a metal. The resonator housing may have threaded bores, into which mounting screws for fastening the cover can be screwed.

The resonator space may have an inner wall, for example a cylindrical inner wall, which delimits the resonator space, at least in certain portions, and extends around the resonator space. The inner wall may be interrupted by two apertures, or apertures may be provided in the inner wall.

An electrode configuration for generating an electrical control field may be arranged on the container.

Liquid crystal materials have a dielectric constant that can be controlled. In this way, a filter for example on a satellite in space can be detuned in mid-frequency if the resonators are (partly) filled with liquid crystal material. This is very advantageous. In this case, however, the property of the liquid crystal of having a considerable temperature-dependent volume expansion must be compensated by additional measures.

The container is produced from a certain material and this material has a coefficient of thermal expansion. Similarly, the liquid crystal has a certain coefficient of expansion. Typically, the coefficients of thermal expansion of the container and of the liquid crystal differ. This has the effect that the container and the liquid crystal expand or contract differently when there are high temperature fluctuations. Typically, the liquid crystal has a coefficient of thermal expansion that is higher than the coefficient of thermal expansion of the container. During heating, the liquid crystal has for example a thermally induced linear expansion of 200 ppm/K. Furthermore, the liquid crystal is incompressible. The material of the container has for example a thermally induced linear expansion of 70 ppm/K. This has the effect that, with rising temperatures, the pressure in the container can rise significantly. In order to avoid damage to the container, a compensating device with variable volume may be provided, the compensating device being connected to the cavity of the container such that liquid crystal can flow out of the cavity of the container into the compensating device and vice versa when the volume of the liquid crystal changes as a result of thermal influences.

A compensating device requires a certain installation space and must additionally also be connected fluid-tightly to the cavity of the container. In order to eliminate the aspects associated with the compensating device, it is proposed in the present case to compensate for the compensation resulting from different coefficients of thermal expansion of the container and the liquid crystal by the compensating element.

The container is produced from a material that is transparent to high-frequency electromagnetic fields and has low losses for high-frequency electromagnetic fields, and similarly is distinguished by low outgassing rates for aerospace applications. Such a material may be a crosslinked polystyrene, which is for example sold under the name REXOLITE.

Like the liquid crystal, the compensating element is arranged in the cavity of the container. In addition, the compensating element has a coefficient of thermal expansion that is lower or even much lower than the coefficient of thermal expansion of the liquid crystal. If therefore the liquid crystal expands under rising temperatures and takes up more volume, the compensating element expands to a lesser extent. In this way, an internal pressure occurring in the container can be kept at a lower value.

The compensating element takes up a certain volume in the cavity of the container. As a result, the amount of liquid crystal can be additionally reduced. Furthermore, the amount of liquid crystal required is reduced by dispensing with a compensating device, which would likewise have to be filled with liquid crystal.

According to one embodiment, the coefficient of thermal expansion of the compensating element is lower than a coefficient of thermal expansion of the container.

This means firstly that the container expands under rising temperatures, whereby the volume of the cavity likewise increases. However, the liquid crystal likewise expands under rising temperatures, but the compensating element has a coefficient of thermal expansion that is lower than the coefficient of thermal expansion of the container and of the liquid crystal. The volume taken up by the compensating element in the cavity of the container can remain virtually the same over a great temperature range or change only slightly. The volume of the cavity that is increased by the expansion of the container can thus be used by the liquid crystal alone. As a result, different coefficients of thermal expansion of the container and of the liquid crystal are compensated.

According to a further embodiment, the container is formed as a rod and arranged in the resonator housing such that the container protrudes from an inner wall of the resonator housing into the resonator space, the compensating element being arranged in the cavity of the container such that it is located outside the resonator space.

In other words, the liquid crystal is to be located in the resonator space in order to be able to set the frequency of the resonator space and the compensating element is not to be located in the resonator space.

According to a further embodiment, the container has a first longitudinal portion and a second longitudinal portion, the second longitudinal portion adjoining an opening of the container and the first longitudinal portion adjoining the second longitudinal portion, a diameter of the first longitudinal portion being smaller than a diameter of the second longitudinal portion.

The container is formed as a cylinder or as a rod and the cavity is a depression in the longitudinal direction of the container from one end face in the direction of the other end face. The cavity is therefore a blind hole with an opening at one end face of the container. Taken from this opening in the direction of the bottom of the cavity or in the direction of the other end face, the cavity is divided into two longitudinal portions of different diameters. The first longitudinal portion runs in the resonator space of the resonator.

According to a further embodiment, the compensating element is arranged in the second longitudinal portion.

Consequently, the compensating element is arranged outside the resonator space. Conversely, the longitudinal portion of the container that is merely filled with liquid crystal is arranged inside the resonator space.

According to a further embodiment, the second longitudinal portion is arranged completely outside the resonator space.

This means that the longitudinal portion of the container that extends into the resonator space has a constant diameter of the cavity over the extent of the resonator space.

According to a further embodiment, the compensating element has a greater diameter than the first longitudinal portion.

Consequently, the compensating element cannot move into the first longitudinal portion, even if the compensating element is freely movable in the cavity of the container.

The compensating element may be a cylindrical body. However, the compensating element may also have other forms, for example cuboidal or right-parallelepipedal.

According to a further embodiment, the compensating element has a smaller diameter than the second longitudinal portion.

Consequently, the compensating element can move freely in the second longitudinal portion of the cavity and does not exert any pressure on an inner wall of the container. The compensating element may be dimensioned such that the diameter of the second longitudinal portion (inside diameter of the cavity) is greater than the diameter of the compensating element (outside diameter) even whenever the container has shrunk to its smallest size at the lowest temperature to be expected.

According to a further embodiment, the container has a cover, the compensating element being arranged on an inner side of the cover and protruding into the cavity of the container.

This embodiment has the advantage that the compensating element is arranged immovably in the cavity. For example, the compensating element may be arranged on the cover such that it is central with respect to a longitudinal axis of the cavity of the container.

The compensating element may be adhesively attached or fastened in some other way to the inner side of the cover. For example, the compensating element may be mechanically connected to the cover by way of a plug-in connection, clamping connection or screw connection. Alternatively, the compensating element may also be arranged or fastened on the inner wall of the cavity.

According to a further embodiment, the cover is produced from the same material as the container.

The cover serves the purpose of closing the container fluid-tightly and avoiding any escape or run-out of the liquid crystal. Once the cavity of the container has been filled with the liquid crystal and the compensating element, the cavity of the container is closed with the cover. Because the container and the cover are produced from the same material, a simple connecting technique can be used. In other words, different materials do not have to be connected to one another at this point, as could be the case for example when using a compensating device.

The container and the cover may for example be connected to one another in a material-bonding manner, with or without an auxiliary substance (welding, soldering, adhesive bonding).

According to a further embodiment, the compensating element comprises quartz glass.

The compensating element may completely consist of quartz glass. Quartz glass has a very low linear thermal expansion. It may lie in the range of 1 ppm/K.

An alternative material would be the metal Invar, with a coefficient of expansion of even less than 2 ppm/K. It is also conceivable that two or more materials are combined in the compensating element.

The approach described here can in other words be summarized as follows:

It is provided that a compensating element (also: a body, for example a freely movable or floating body or a body connected to part of the container) that has a very small linear thermal expansion is introduced into a container filled with liquid crystal. By means of a step or a change in the inside diameter of the container, it is ensured that the compensating element does not get into regions of the container where it can disturb the high-frequency properties of the resonator. The body may for example be quartz glass.

Quartz glass has a very low linear thermal expansion of about 1 ppm/K. It is a material known in aerospace. When this arrangement is heated, significantly less additional volume is taken up by the liquid crystal, since the absolute volume of the liquid crystal is reduced by the volume of the floating body. Furthermore, on account of a very small thermal expansion, the compensating element itself takes up almost no additional volume when there is a temperature increase. With suitable design (setting the volume of the floating body for a given interior volume of the container and for given coefficients of thermal expansion of the container, of the liquid crystal and of the compensating element), it is possible to set the system such that no positive pressure or negative pressure occurs when there is a change in temperature. Then it is also no longer necessary to provide a flexible metal bellows (compensating device). Rather, the container may be closed off on the side on which the metal bellows was attached by a simple wall (cover). If this wall is also made of the same material as the container, the connecting technique is simplified, since then only materials of the same type have to be connected to one another.

According to a further aspect, a filter that has at least one resonator as described herein is provided.

The filter may be an IMUX filter for a communication system of a communications satellite. The filter may be used in the high-frequency range, for example in the range of several GHz to several 10 GHz or in the usual frequency bands for satellite communication.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

There follows a description of an exemplary embodiment of the present invention with reference to the figures. It should be noted that elements that are the same or similar are identified in the figures by the same designations. The representations in the figures are schematic and not to scale.

Figure 1:
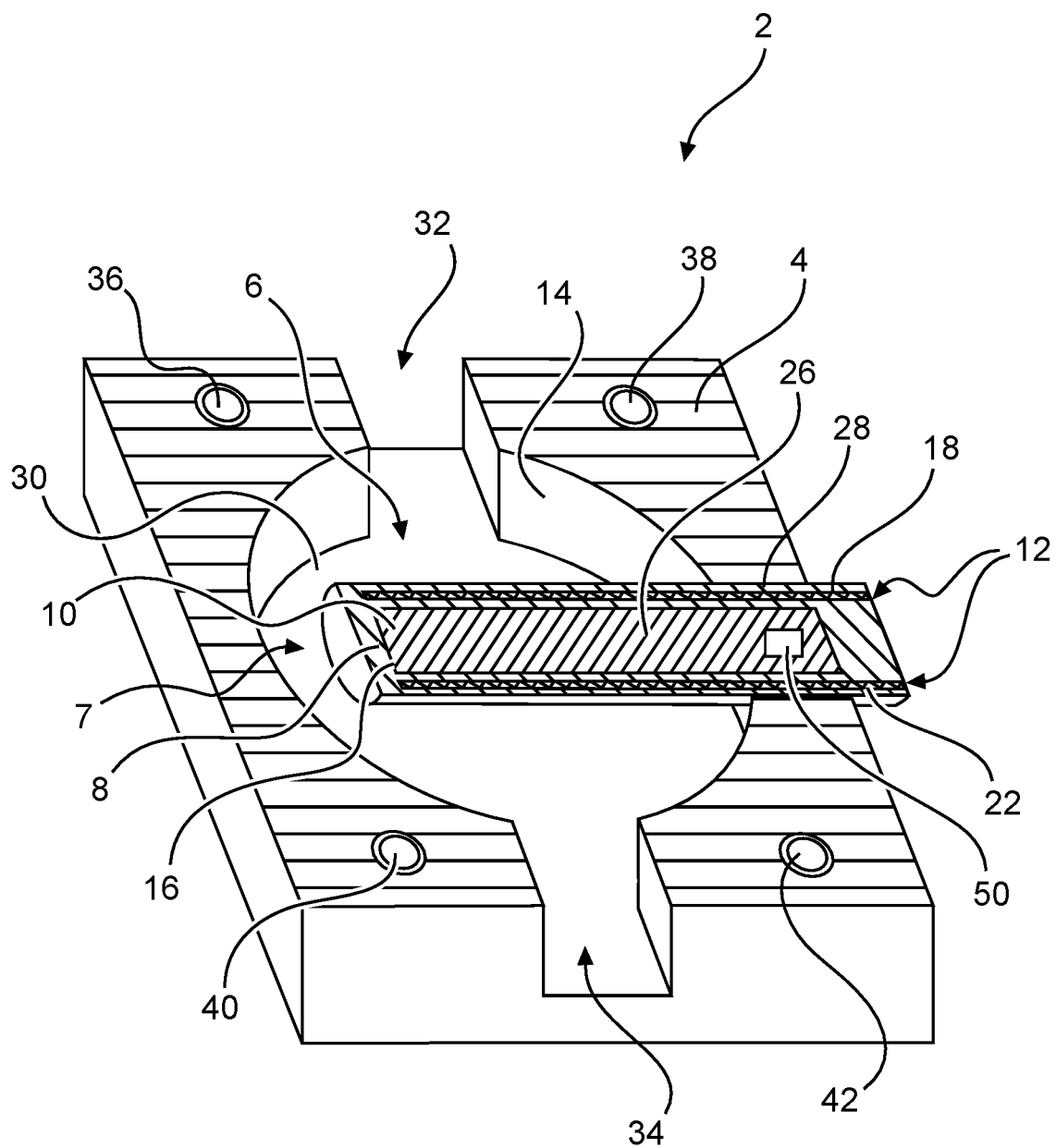
FIG. 1 shows a perspective sectional view of a resonator according to an exemplary embodiment.

FIG. 1 shows a perspective sectional representation of a resonator 2 according to an exemplary embodiment. The sectional representation is chosen here such that the resonator has been cut approximately vertically through the middle. However, the representation is only schematic and serves for explaining the design of the resonator 2.

The resonator 2 shown in FIG. 1 has a resonator housing 4, which has in it a resonator space 6, in which it is intended that the resonant frequency can be set. In the case of the exemplary embodiment shown, the resonator space 6 is delimited by a bottom surface 30 and is in addition of such a construction that the upper end of the resonator space 6 can be closed by a suitable cover (not shown). Provided for this purpose in the resonator housing 4 are a number of threaded bores 36, 38, 40, 42, in which mounting screws for fastening the cover on the resonator housing 4 can be accommodated. Furthermore, in the exemplary embodiment shown, the resonator space 6 is delimited by a cylindrical inner wall 14, which extends around the resonator space 6 and is merely interrupted by two apertures 32, 34. These two apertures 32, 34 make the resonator 2 according to the exemplary embodiment shown here suitable for use in a filter. However, it should be mentioned in this connection that the construction of the resonator housing 4 is not restricted to the construction shown here. Depending on the area of use of the resonator, the resonator housing may also be formed without the apertures 32 and 34 and in a different form. To put it another way, the resonator space does not have to be formed substantially cylindrically, as shown for example in FIG. 1.

In order to be able to set the resonant frequency of the resonator 2, the resonator 2 according to the present exemplary embodiment has an electrically adjustable dielectric 7, which in the case described is provided in the form of a container 8, in which a liquid crystal 10 is contained. In the exemplary embodiment shown, the container 8 is formed as a rod. To put it another way, the container 8 has a form which is shaped in the manner of a straight circular cylinder. Furthermore, the container 8 is produced from a dielectric material.

As shown in FIG. 1, the container 8 extends in a substantially horizontal direction and in this case in particular parallel to the bottom surface 30 of the resonator housing 4. Furthermore, the container 8 is arranged such that it is oriented substantially perpendicularly to the direction of extent of the two apertures 32, 34. Accordingly, a longitudinal axis of the container 8 extends substantially perpendicularly to the direction of extent of the two apertures 32, 34 parallel to the bottom surface 30 of the resonator housing 4. The longitudinal axis of the container 8 in this case coincides with an axis of a circular cylinder. In this case it should be noted that the container 8 does not have to be formed completely circular-cylindrically. Rather, the container 8 may also have for example on the right side in FIG. 1, that is to say outside the resonator housing 4, a form deviating from the form of a circular cylinder. Also, the container 8 does not have to be formed as a straight circular cylinder in the interior of the resonator housing 4, but may be of any conceivable form that ensures a function of the electrically adjustable dielectric 7.

In order to arrange the electrically adjustable dielectric 7 in the way described above, the resonator housing 4 has in its inner wall 14 an opening 28, in which the electrically adjustable dielectric 7, in particular the container 8, is fitted and fastened such that the front end of the electrically adjustable dielectric 7 projects from the inner wall 14 and protrudes into the interior space 6 of the resonator 2. The opening 28 has in this case a form that is formed in a way corresponding to the form of the outer circumference of the electrically adjustable dielectric 7 or of the container 8. In the embodiment shown, the opening 28 is formed circular-cylindrically, the axis of extent of the opening 28, like the axis of extent of the container 8, being oriented parallel to the bottom surface 30 and substantially perpendicularly to the axes of extent of the apertures 32, 34. Furthermore, the opening 28 is arranged at a predetermined distance from the bottom surface 30, whereby the container 8 with the construction shown in FIG. 1 is at a distance from the bottom surface 30. Although not represented in FIG. 1, the opening 28 is also arranged at a predetermined distance from an upper end of the inner wall 14, so that the electrically adjustable dielectric 7 or its container 8 is also arranged at a predetermined distance from the upper end of the resonator housing 4, and consequently at a predetermined distance from a cover (not shown) that is used for closing the resonator housing 4. Altogether, the container 8 consequently protrudes from the inner wall 14 into the resonator space 6 in such a way that the part of the container 8 that is located in the resonator space 6 is at a distance from at least the bottom surface 30 and the cover (not shown). Apart from the preferred construction last described, however, there may also be a different arrangement of the container in the resonator housing 4, as long as such an arrangement makes changing of the resonant frequency in the interior of the resonator 2 possible.

As also shown in FIG. 1, apart from the already described container 8, the electrically controllable dielectric 7 has the liquid crystal 10, which is contained in a cavity 26 of the container 8. The liquid crystal 10 can be activated by an electrical control field. To be more precise, the permittivity of the liquid crystal 10 can be influenced by applying an electrical field. The cavity 26 of the container 8 is likewise formed circular-cylindrically, to be more precise in such a way that the cylinder axes of the container 8 and the cavity 26 coincide. The container 8 consequently has at least in certain portions the form of a hollow cylinder.

For the sake of completeness, an electrode structure 12 with electrodes 18, 22 is shown here. However, it is pointed out that the electrode structure and the electrical control field generated by it are not in a functional relationship with the function of the compensating element. The electrical control field may also be generated in a way other than that described here, without having an influence on the compensation of the different coefficients of thermal expansion by the compensating element.

Lastly, a compensating element 50 is shown in the cavity 16 of the container 8. The compensating element 50 is positioned in the cavity 16 such that it is not in the longitudinal portion of the container 8 that protrudes into the resonator space 6. In other words, the compensating element 50 is outside or behind the inner wall 14.

In the case of temperature fluctuations, the materials of the components shown here expand. On account of their material properties, the container 8 and the liquid crystal 10 have different coefficients of thermal expansion. The compensating element 50 has a coefficient of thermal expansion that is lower than the coefficient of thermal expansion of the container 8 and of the liquid crystal 10. As a result, the different thermal expansion of the container 8 and the liquid crystal 10 can be compensated without a compensating device being used.

As FIG. 1 reveals, the container may be rod-shaped and the cavity 16 extends in the longitudinal direction of the container 8. In particular, the cavity 16 is formed circular-cylindrically. The container 8 is produced from a dielectric material.

Altogether, consequently, an improved electrically controllable dielectric and an improved resonator that is suitable in particular for high-frequency applications in outer space are provided. An application for the resonator provided here, as a high-frequency resonator, may be for example in an IMUX filter. Furthermore, the container 8 can be used in a closed state, since the compensation of temperature-induced expansion takes place by way of the compensating element 50.

Figure 2:
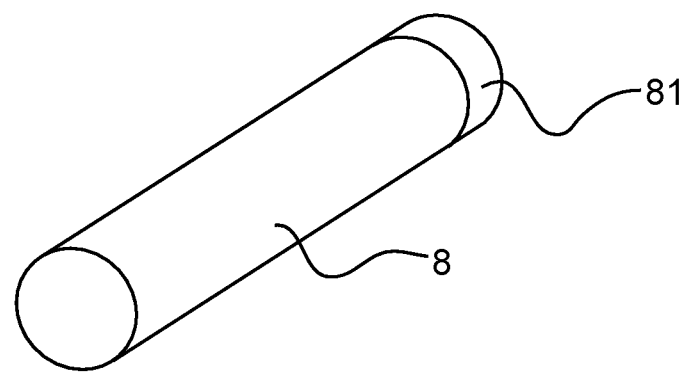
FIG. 2 shows a schematic representation of a container for a resonator according to an exemplary embodiment.

FIG. 2 shows a schematic isometric representation of the container 8. The container 8 is closed by a cover 81. The cover 81 and the container 8 are preferably produced from the same material.

Figure 3:
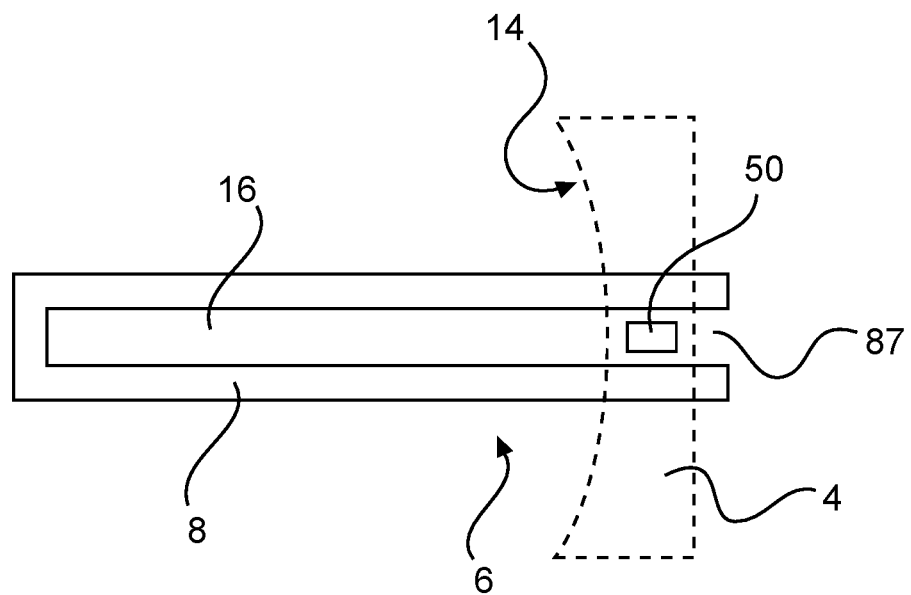
FIG. 3 shows a schematic representation of a container for a resonator according to an exemplary embodiment.

FIG. 3 shows a schematic representation of a container 8 with respect to the resonator housing 4 (shown by dashed lines). The container 8 has in its interior a cavity 16, which extends from right to left along the longitudinal direction of the container 8. The cavity 16 may be a bore extending from one end face (in this example on the right) in the direction of the opposite end face (in this example on the left). Consequently, on the right side there is an opening 87. This opening 87 can be used for filling the cavity 16 with liquid crystal. Likewise arranged in the cavity 16 is the compensating element 50.

The container 8 is arranged with respect to the resonator space 6 such that a portion of the container 8 protrudes into the resonator space 6 (this is the portion to the left of the inner wall 14). A further portion of the container 8 extends through the resonator housing 4 (this is the portion to the right of the inner wall 14). The compensating element 50 is located in the portion of the container 8 that is to the right of the inner wall 14. In other words, the compensating element 50 is located outside the resonator space 6.

In the example shown, the cavity 16 has a volume of several cubic millimeters. Even if the cover 81 (FIG. 2) is not shown in FIG. 3, the cover is a component part of it and also of other exemplary embodiments.

Figure 4:
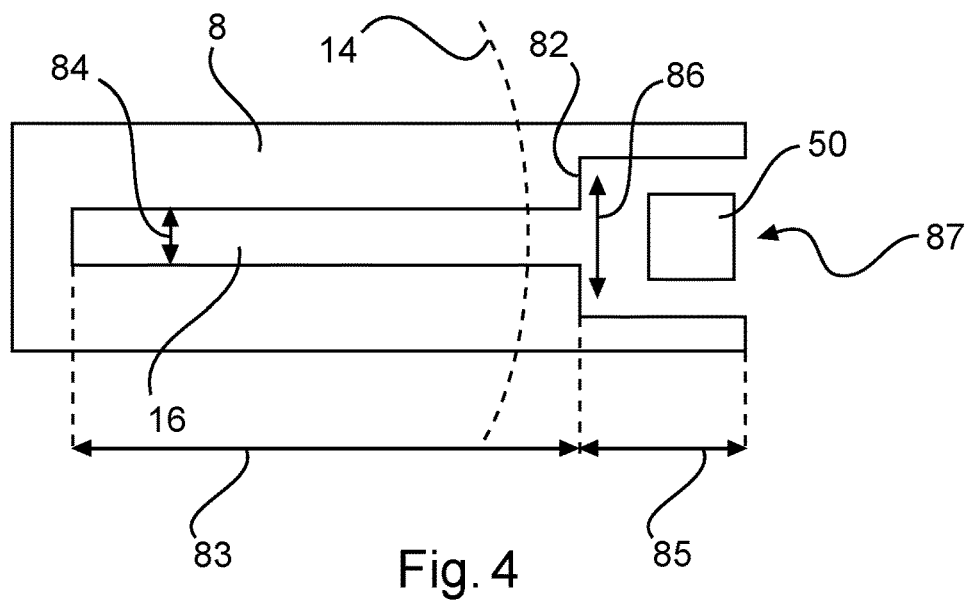
FIG. 4 shows a schematic representation of a container for a resonator according to an exemplary embodiment.

FIG. 4 shows a further exemplary embodiment of the container 8. The cavity 16 is divided into a first longitudinal portion 83 with an inside diameter 84 and a second longitudinal portion 85 with an inside diameter 86. The second longitudinal portion 85 directly adjoins the opening 87. At the transition between the second longitudinal portion 85 and the first longitudinal portion 83 there is a stepped formation 82 or a step, because the inside diameter is reduced at this transition.

The second longitudinal portion 85 is located outside the resonator space 6 behind the inner wall 14. Both the first longitudinal portion 83 and the second longitudinal portion 85 have an unvarying or constant inside diameter in the longitudinal direction (from left to right). Depending on what is required of the resonator, the inside diameter of the first longitudinal portion and/or of the second longitudinal portion may also vary in the longitudinal direction.

The compensating element 50 is arranged in the second longitudinal portion 85 to the right of the inner wall 14 and outside the resonator space 6. The stepped formation 82 has the function of hindering the compensating element 50 from moving into the first longitudinal portion 83 of the cavity 16 or into the resonator space 6.

The stepped formation 82 has, seen from the right, a resting surface, on which the compensating element 50 can rest. It may happen that the compensating element 50 closes the first longitudinal portion 83 of the cavity 16, because the compensating element 50 lies on the resting surface of the stepped formation 82. If in such a case the temperature falls and the liquid crystal in the cavity 16 is reduced in its volume, a negative pressure may occur in the first longitudinal portion 83 if a flow movement of the liquid crystal out of the second longitudinal portion 85 into the first longitudinal portion 83 is blocked. In order to prevent this, the resting surface of the stepped formation 82 may have depressions or surface irregularities that can serve as flow channels for the liquid crystal and can allow a flowing movement of the liquid crystal between the first longitudinal portion 83 and the second longitudinal portion 85 under all circumstances.

Figure 5:
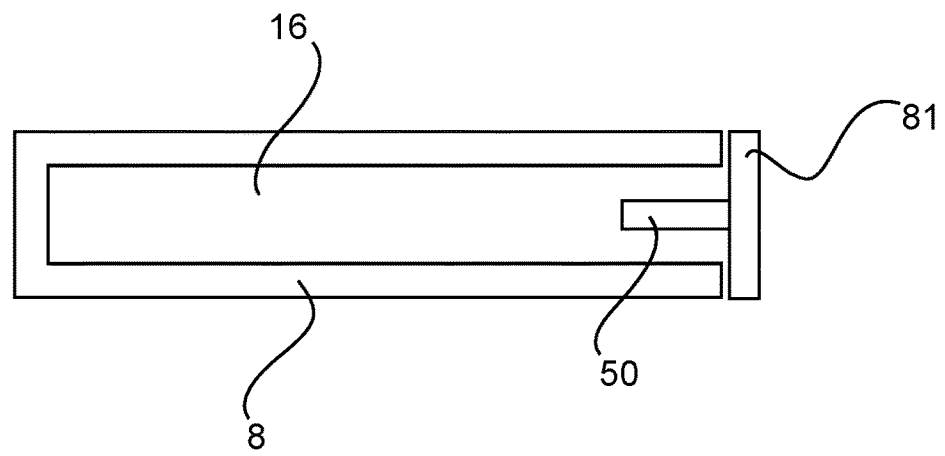
FIG. 5 shows a schematic representation of a container for a resonator according to an exemplary embodiment.

FIG. 5 shows a schematic lateral sectional view of a container 8. The cavity 16 has been closed with a cover 81. Arranged or fastened on an inner surface of the cover 81 is the compensating element 50.

Figure 6:
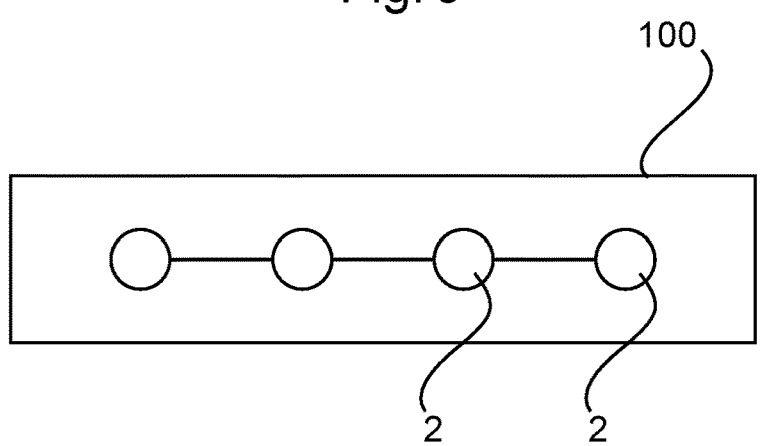
FIG. 6 shows a schematic representation of a filter according to an exemplary embodiment.

FIG. 6 shows a schematic representation of a filter 100. The filter 100 has a number of resonators 2 connected in series. Each resonator 2 may have been set to an individual resonant frequency. Such a filter can be used in a transmission path of a communications satellite.

It is additionally pointed out that "having" or "comprising" does not rule out other elements or steps, and "a" or "an" does not rule out a multiplicity. It is also pointed out that features or steps that have been described with reference to one of the above exemplary embodiments or designs may also be used in combination with other features or steps of other exemplary embodiments or designs described above. Reference designations in the claims are not to be regarded as restrictive.

LIST OF REFERENCE DESIGNATIONS

2 Resonator
4 Resonator housing
6 Resonator space
7 Adjustable dielectric
8 Container
10 Liquid crystal
12 Electrode structure
14 Inner wall
16 Cavity
18 Electrode
22 Electrode
26 Cavity
28 Opening
30 Bottom surface
32 Aperture
34 Aperture
36 Threaded bore
38 Threaded bore
40 Threaded bore
42 Threaded bore
50 Compensating body
81 Cover
82 Stepped formation
83 First longitudinal portion
84 Diameter
85 Second longitudinal portion
86 Diameter
87 Opening
100 Filter While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A resonator for a filter, the resonator comprising:
a resonator housing, in which a resonator space is formed;
a container with a cavity, in which a liquid crystal is contained, the container being at least partially arranged in the resonator space; and
a compensating element arranged in the cavity, the compensating element having a coefficient of thermal expansion that is lower than a coefficient of thermal expansion of the liquid crystal,
the container having a first longitudinal portion and a second longitudinal portion, the second longitudinal portion adjoining an opening of the container and the first longitudinal portion adjoining the second longitudinal portion, and a diameter of the first longitudinal portion being smaller than a diameter of the second longitudinal portion,
the compensating element having a greater diameter than the first longitudinal portion.

2. A resonator for a filter, the resonator comprising:
a resonator housing, in which a resonator space is formed;
a container with a cavity, in which a liquid crystal is contained, the container being at least partially arranged in the resonator space; and
a compensating element arranged in the cavity, the compensating element having a coefficient of thermal expansion that is lower than a coefficient of thermal expansion of the liquid crystal, the coefficient of thermal expansion of the compensating element being lower than a coefficient of thermal expansion of the container.

3. The resonator according to claim 2, the container being formed as a rod and arranged in the resonator housing such that the container protrudes from an inner wall of the resonator housing into the resonator space, and the compensating element being arranged in the cavity of the container such that it is located outside the resonator space.

4. The resonator according to claim 2, the container having a first longitudinal portion and a second longitudinal portion, the second longitudinal portion adjoining an opening of the container and the first longitudinal portion adjoining the second longitudinal portion, and a diameter of the first longitudinal portion being smaller than a diameter of the second longitudinal portion.

5. The resonator according to claim 4, the compensating element being arranged in the second longitudinal portion.

6. The resonator according to claim 4, the second longitudinal portion being arranged completely outside the resonator space.

7. The resonator according to claim 4, the compensating element having a smaller diameter than the second longitudinal portion.

8. A filter comprising at least one resonator according to claim 2.

9. The resonator according to claim 2, the container having a cover, the compensating element being arranged on an inner side of the cover and protruding into the cavity of the container.

10. The resonator according to claim 9, the cover being produced from the same material as the container.

11. The resonator according to claim 2, the compensating element comprising quartz glass.

* * * * *